(12) United States Patent
Goh et al.

(10) Patent No.: US 7,268,048 B2
(45) Date of Patent: Sep. 11, 2007

(54) METHODS FOR ELIMINATION OF ARSENIC BASED DEFECTS IN SEMICONDUCTOR DEVICES WITH ISOLATION REGIONS

(75) Inventors: Yin-Min Felicia Goh, Singapore (SG); Simon Chooi, Singapore (SG); Teck Wee Lim, Singapore (SG); Vincent Sih, Singapore (SG); Chian Yuh Sin, Singapore (SG); Ping Yu Ee, Singapore (SG); Zainab Ismail, Singapore (SG); Cher Sian Chua, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 307 days.

(21) Appl. No.: 10/913,214

(22) Filed: Aug. 6, 2004

(65) Prior Publication Data
US 2006/0030095 A1    Feb. 9, 2006

(51) Int. Cl.
*H01L 21/4763* (2006.01)
*H01L 21/44* (2006.01)
*H01L 21/302* (2006.01)

(52) U.S. Cl. .................. 438/296; 438/651; 438/655; 438/682; 257/E21.546; 257/E21.619

(58) Field of Classification Search ............... 438/296, 438/651, 655, 682; 257/E21.546, E21.619
See application file for complete search history.

(56) References Cited

U.S. PATENT DOCUMENTS

| 4,830,971 | A  | * | 5/1989 | Shibata ................... 438/143 |
| 5,316,965 | A  | * | 5/1994 | Philipossian et al. ....... 438/424 |
| 6,354,309 | B1 | * | 3/2002 | Arndt et al. ................ 134/1.3 |
| 6,423,147 | B1 | * | 7/2002 | Chang ........................ 134/2 |
| 6,569,766 | B1 |   | 5/2003 | Hamanaka et al. ......... 438/683 |
| 6,673,126 | B2 |   | 1/2004 | Miyasaka .................. 29/25.01 |
| 6,811,448 | B1 | * | 11/2004 | Paton et al. ................ 439/706 |

* cited by examiner

*Primary Examiner*—William M. Brewster

(57) ABSTRACT

Methods of preparing conductive regions such as source/drain regions for silicidation procedures, has been developed. The methods feature removal of native oxide as well as removal of deposited arsenic based defects from conductive surfaces prior to deposition of a metal component of subsequently formed metal silicide regions. Arsenic ions implanted for N type source/drain regions are also implanted into insulator regions such as insulator filled shallow trench isolation regions. A hydrofluoric acid cycle used as a component of the pre-silicidation preparation procedure can release arsenic from the shallow trench isolation regions in the form of arsenic based defects, which in turn can re-deposit on the surface of source/drain region. Therefore pre-silicidation preparation treatments described in this invention feature removal of both native oxide and arsenic based defects from conductive surfaces prior to metal silicide formation. Methods include wet etch procedures featuring hydrofluoric acid and hydrogen peroxide, as well as spin dry and dry etch procedures both employed post hydrofluoric acid treatment to remove re-deposited arsenic based defects.

12 Claims, 3 Drawing Sheets

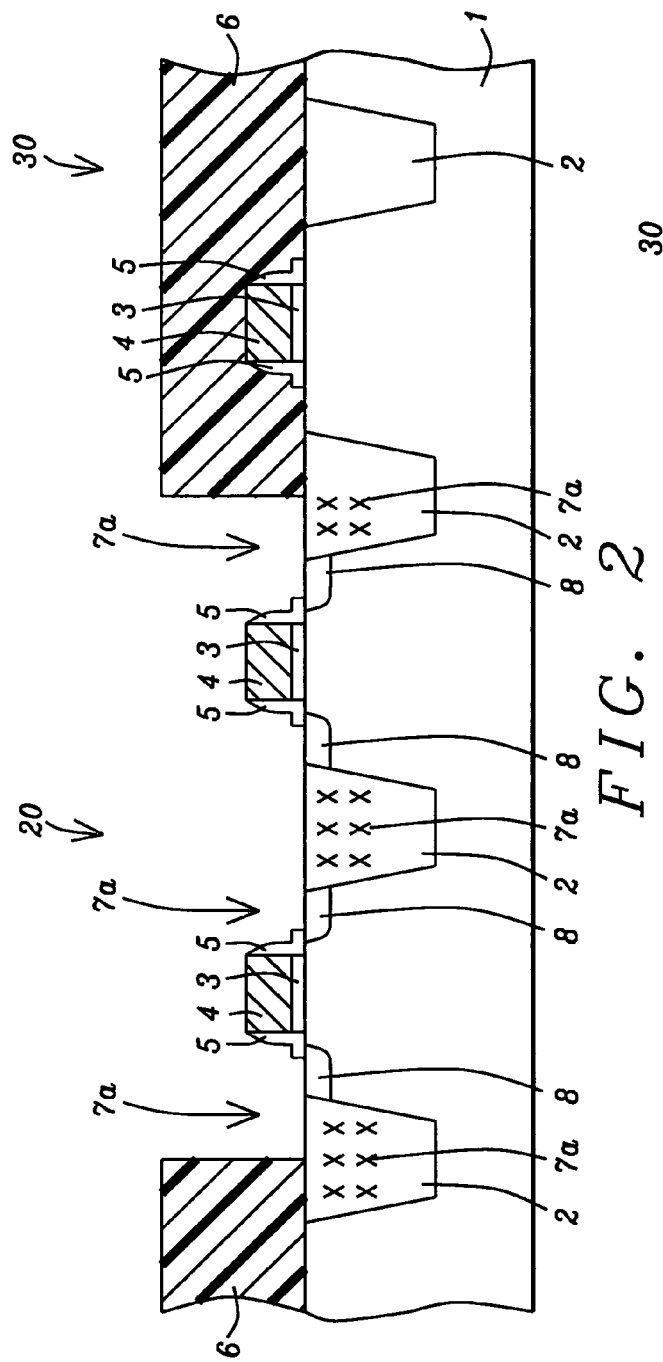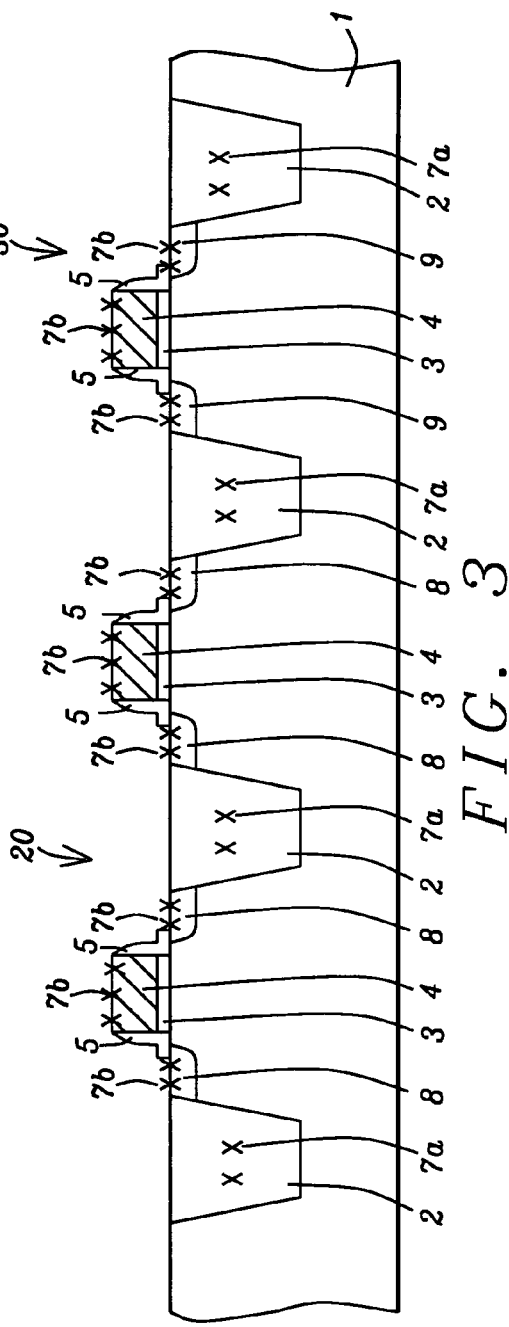

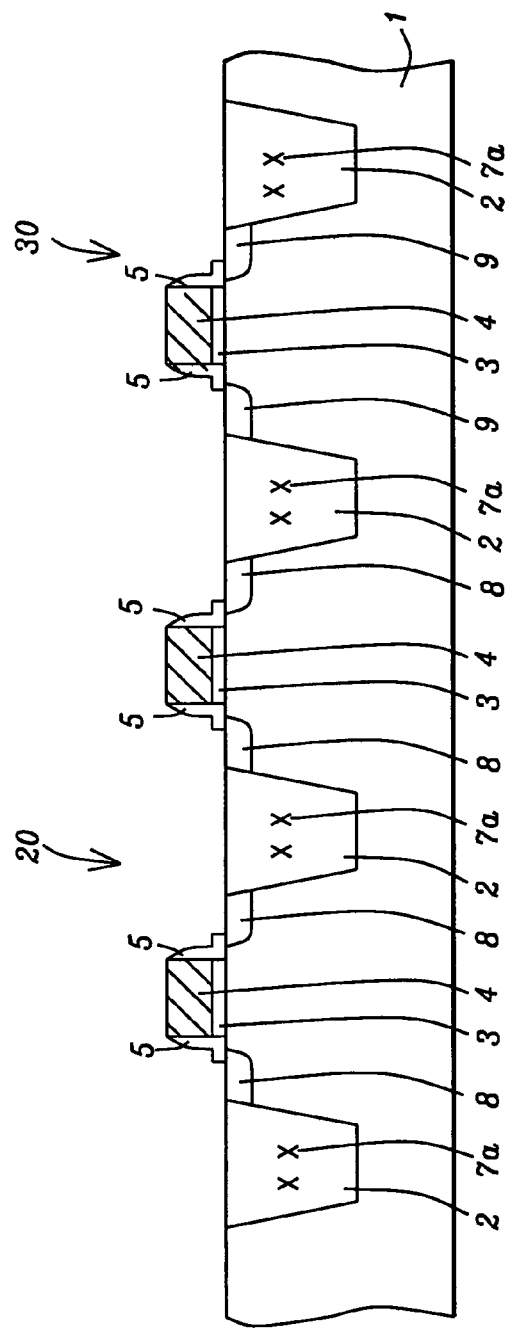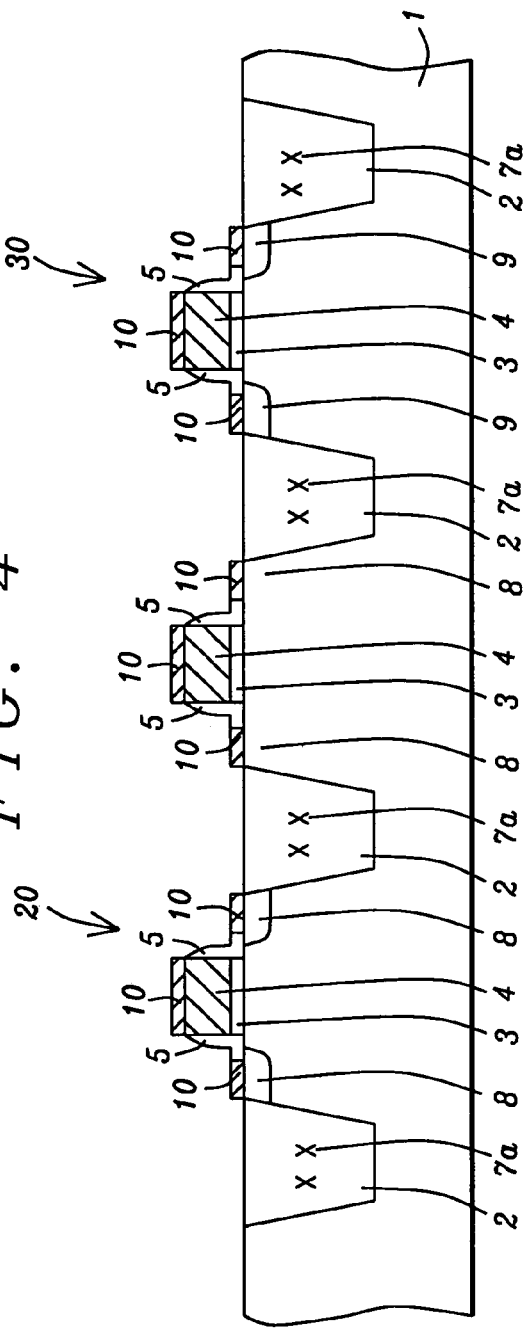

METHODS FOR ELIMINATION OF ARSENIC BASED DEFECTS IN SEMICONDUCTOR DEVICES WITH ISOLATION REGIONS

BACKGROUND OF THE INVENTION (1) Field of the Invention

The present invention relates to methods used to fabricate semiconductor devices, and more specifically to methods used to prepare semiconductor surfaces for metal silicide formation.

(2) Description of Prior Art

Micro-miniaturization or the ability to fabricate semiconductor devices with sub-micron features has allowed semiconductor device performance to be increased. Decreases in performance degrading junction capacitances has been achieved as a result of the sub-micron features used for semiconductor devices. However in addition to the capacitance decreases resulting with the use of sub-micron device features, device performance has also been enhanced via the use of lower resistance materials. For example word line and source/drain resistances have been reduced via the use of metal silicide regions formed on both the word line and source/drain regions. Formation of metal silicide on these regions is accomplished selectively via a self aligned metal silicide (salicide) procedure in which metal silicide is formed only selectively on exposed conductive regions such as a polysilicon word line structure and semiconductor source/drain regions. To ensure optimum salicide formation the surfaces of these exposed conductive regions have to be hydrophobic or oxide free, usually accomplished via use of a hydrofluoric acid type wet clean procedure. However insulator regions such as shallow trench isolation (STI) regions incorporated with arsenic ions as a result of previously being exposed to an arsenic ion implantation procedure used for source/drain regions for N channel metal oxide semiconductor field effect transistor (MOSFET) devices, can release the incorporated arsenic ions during the hydrofluoric acid, salicide pre-clean procedure. The released arsenic ions, now in the form of arsenic based defects, can deposit on exposed conductive surfaces such as the word line and source/drain surface, thus deleteriously interfering with subsequent salicide formation on these surfaces.

This invention will describe various solutions for removal of arsenic based defects on conductive surfaces prior to salicide formation. The novel process sequences described in the present invention used for solution or elimination of arsenic based defects allow optimum metal silicide regions to be formed on exposed conductive regions. Prior art such as Hamanaka et al in U.S. Pat. No. 6,569,766 B1, as well as Miyasaka in U.S. Pat. No. 6,673,126 B2, describe cleaning procedures used at various stages of a semiconductor fabrication procedures. However none of the above art describe the novel process solutions offered in the present invention which allows an oxide free and arsenic based defect free conductive surface to be achieved prior to the salicide formation procedure.

SUMMARY OF THE INVENTION

It is an object of this invention to prepare conductive regions for metal silicide accommodation.

It is another object of this invention to remove insulator material from the surfaces of conductive regions prior to metal silicide formation via a wet hydrofluoric acid procedure.

It is still another object of this invention to remove arsenic based defects from hydrofluoric acid cleaned conductive regions prior to metal silicide using novel wet or dry processes, wherein formation of the arsenic based defects on the conductive region surfaces resulted from exposure of insulator regions to a wet hydrofluoric acid procedure.

In accordance with the present invention methods of removing arsenic based defects from the surfaces of conductive regions of an N channel MOSFET device prior to metal silicide formation, is described. After formation of the insulator filled STI regions and definition of conductive gate structures overlying gate insulator layers, arsenic source/drain regions are formed via ion implantation into portions of a semiconductor substrate not covered by the conductive gate structure or occupied by the STI regions, with arsenic ions also implanted into top portions of the STI regions. Prior to metal silicide formation a wet hydrofluoric acid procedure is employed to remove unwanted oxide from the surface of the source/drain region however with the wet hydrofluoric acid procedure also resulting in unwanted arsenic based defects released from the top portions of the STI regions and depositing on exposed source/drain surfaces. Several processes used to remove arsenic based defects from the surface of the conductive regions feature wet procedures in which hydrogen peroxide is employed in conjunction with the hydrofluoric acid procedure to oxidize and remove the arsenic based defects. In addition dry procedures such as spin drying and hydrogen dry etching are employed after a wet hydrofluoric acid procedure to remove arsenic based defects from the surface of conductive regions prior to metal silicide formation.

BRIEF DESCRIPTION OF THE DRAWINGS

The object and other advantages of this invention are best described in the preferred embodiment with reference to the attached drawings that include:

FIGS. 1-5, which schematically in cross-sectional style show key stages used to selectively form metal silicide on conductive regions of an N channel MOSFET device, wherein the surfaces of the conductive regions were treated to eliminate arsenic based defects prior to metal silicide formation.

DESCRIPTION OF PREFERRED EMBODIMENTS

Figure 1:
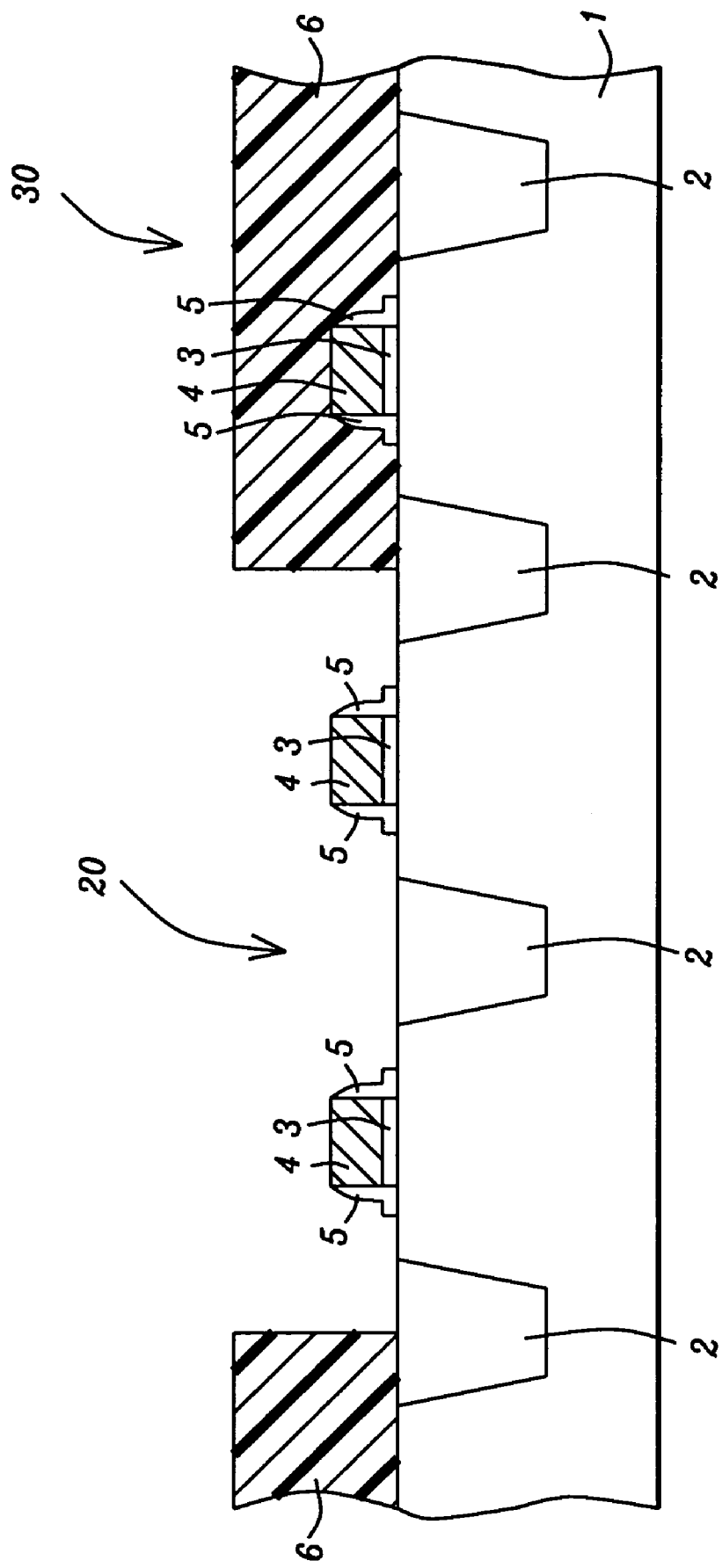

Methods of preparing conductive regions for accommodation of metal silicide regions featuring removal of arsenic based defects from the conductive surfaces prior to metal silicide formation, will now be described in detail. This invention will be described for preparing an N channel MOSFET device for metal silicide processing. The arsenic based defects deleteriously influencing the success of metal silicide formation is present as a result of the hydrofluoric acid component of the metal silicide pre-clean procedures, with the hydrofluoric acid allowing release of arsenic material previously embedded in insulator regions such as insulator filled, STI regions, and now deposited on the surfaces of conductive regions designed to accommodate metal silicide. Embedded arsenic material in STI regions can be introduced during N type source/drain ion implantation procedure used for formation of N channel MOSFET devices. However this invention can also be applied to other devices such as a P channel MOSFET device in which arsenic implantation into exposed STI regions can also occur during N well fabrication.

An N channel device at a fabrication stage prior to N type, source/drain formation, is schematically shown in FIG. 1. Semiconductor substrate 1, comprised of P type single crystalline silicon is used. Region 20, will be used to accommodate an N channel MOSFET device, while region 30, of semiconductor substrate 1, will be used to accommodate a P channel MOSFET device. Insulator filled, shallow trench isolation (STI) regions 2, are formed via dry etching procedures defining shallow trench shapes in top portions of semiconductor substrate 1, followed by filling of the shallow trench shapes with silicon oxide. Gate insulator layer 3, comprised of silicon dioxide is thermally grown to a thickness between about 15 to 200 Angstroms, followed by formation of overlying conductive gate structures 4. Conductive gate structures 4, at a thickness between about 500 to 3000 Angstroms, are comprised of doped polysilicon, wherein a blanket polysilicon layer is first obtained via low pressure chemical vapor deposition (LPCVD) procedures followed by definition employing photolithographic and dry etching procedures. Insulator spacers 5, at a thickness between about 10 to 1000 Angstroms, comprised of silicon oxide or silicon nitride, are next formed on the sides of polysilicon gate structures 4, accomplished via LPCVD or plasma enhanced chemical vapor deposition (PECVD) of the silicon oxide or silicon nitride layer followed by an anisotropic dry etching procedure. Insulator spacers 5, shown as L shaped structures in the drawings are formed by depositing a composite insulator layer such as an underlying silicon nitride layer, at a thickness between 10 and 1000 Angstroms, followed by the deposition of an underlying silicon oxide layer. After the anisotropic dry etching procedure the silicon oxide spacer shape is selectively removed via wet etch procedures resulting in L shaped insulator structure 5, shown schematically in FIG. 1. Photoresist shape 6, is then formed to expose only N channel MOSFET region 20, to a subsequent arsenic ion implantation procedure to be employed for creation of an N type source/drain region.

With P channel MOSFET region protected by photoresist shape 6, an arsenic ion implantation procedure is performed at an energy between about 10 to 100 KeV, at a dose between about 1E15 to 1E16 atoms/cm$^2$. In addition to forming N type source/drain regions 8, in regions of semiconductor substrate 1, not covered by polysilicon gate structures 4, or occupied by STI regions 2, arsenic ions 7a, are also implanted into top portions of insulator filled, STI regions 2. The depth of arsenic ions 7a, in STI region 2, is a function of implantation energy with the lower energy placing arsenic ions near the top surface of the STI regions thus increasing the possibility of removal or release during subsequent blanket, wet hydrofluoric acid procedures. The result of the arsenic implantation procedure is schematically shown in FIG. 2.

Removal of photoresist shape 6, is accomplished via plasma oxygen ashing procedures resulting in the formation of native or silicon oxide on the top surfaces of N type source/drain region 8, and polysilicon gate structure 4. For successful metal silicide formation on N type source/drain region 8, as well as on the top surface of polysilicon gate structure 4, the native oxide formed during the photoresist removal procedure has to be completely removed. Wet procedures featuring hydrofluoric acid can be used to remove unwanted silicon oxide from the N type source/drain region and polysilicon gate structure, however this procedure will also remove a top portion of silicon oxide from insulator filled, STI regions 2. The removal of silicon oxide from STI regions also results in the release of some arsenic ions implanted into top portions of STI region 2, with the released arsenic ions now being in the form of arsenic based defects 7b. Arsenic based defects 7b, redeposited on the surfaces of N type source/drain region 8, as well as on the top surfaces of polysilicon gate structures 4, are comprised of crystalline as well as non-crystalline forms. This is schematically shown in FIG. 3. If not removed arsenic based defects 7b, will deleteriously influence the ability to form metal suicide on N type source/drain region 8, or on exposed top surfaces of polysilicon gate structure 4.

Solutions used to avoid the presence of, or used for removal of arsenic based defects from areas to be subsequently subjected to the metal suicide formation procedure, will now be described. A first category of methods used to prevent or remove arsenic based defects features the use of hydrogen peroxide ($H_2O_2$) either independently or as a component of a wet hydrofluoric acid procedure used to remove native oxide prior to a metal suicide formation procedure. Hydrogen peroxide alone will oxidize the unwanted arsenic based defects resulting in a water soluble product. It may also result in additional formation of native oxide on exposed silicon or polysilicon surfaces unless dilute solutions of $H_2O_2$ are used. Hydrogen peroxide can be spiked into the deionized water rinse after HF, at an HF water ratio between about 1:50 to 1:1000. Alternatively a procedure featuring a mixture of hydrogen peroxide and hydrofluoric acid can accomplish oxidation or removal of the arsenic based defects as well as removal of all native oxide. This mixture can be used in several variations such as a HF/hydrogen peroxide procedure with an HF to hydrogen peroxide ratio of between about 1:1 to 1000:1, followed by a de-ionized water rinse and a drying procedure. Successful results can also be accomplished via an initial dilute HF cycle followed by a HF/hydrogen peroxide mixture again with an HF to hydrogen peroxide ratio of between about 1:1 to 1000:1, and again followed by a de-ionized water rinse and drying cycle, If desired a mixture comprising HF and a hydrogen peroxide incorporated solution can be used. Examples of hydrogen peroxide incorporated solutions include SPM (sulfuric peroxide mixture), which contains sulfuric acid and hydrogen peroxide, as well as SC2 which contains hydrochloric acid, hydrogen peroxide and water. The ratio of HF to the hydrogen peroxide incorporated solution is between about 1:1 to 1000:1. The novel feature of the above procedures however focuses on oxidation of arsenic based defects via the use of a hydrogen peroxide component and removal of oxide on silicon via the HF component of the wet procedure. FIG. 4, schematically shows surfaces of N type source/drain region 8, as well a top surface for polysilicon gate structures 4, void of arsenic based defects 7b, as a result of the above wet procedures featuring a hydrogen peroxide component.

Unwanted arsenic based defects 7b, located on N type source/drain regions 8, and on polysilicon gate structures 4, can also be removed after an HF only procedure via a spin dry procedure. The loosely adhering arsenic based defects are removed via the centrifugal force created by the circular motion of the spin dry procedure. The spin dry solution can be accomplished in nitrogen using a single wafer or batch tool. In addition to the wet removal and the spin dry removal procedures for arsenic based defects, a third category for removal is the use of hydrogen plasma after an aqueous HF procedure. After removal of native oxide from N type source/drain and polysilicon surfaces via a wet HF procedure a dry etch procedure employing hydrogen is used to remove the arsenic based defects which were a result of release of arsenic ions during the wet HF procedure. A hydrogen/argon or hydrogen/nitrogen ratio between about 1:0 to 1:100, is used at a pressure between about 20 to 300 millitorr, at an rf power between about 150 to 2000 watts, at a temperature between about 15 to 40° C. The hydrogen reacts with the arsenic based defect to form a volatile $AsH_3$ product.

This description featured the preparation of N type source/drain and polysilicon surfaces for metal silicide accommodation via procedures used to remove arsenic based defects from the above mentioned surfaces. However if P channel MOSFET devices are to be formed in region 30, of semiconductor substrate 1, photoresist masking of region 20, would be performed allowing a boron ion implantation procedure to form P type source/drain regions 9, only in portions of region 30, not covered by polysilicon gate structure 4, or occupied by STI region 2. Removal of the masking photoresist shape again would form unwanted oxide on conductive regions necessitating the oxide removal procedures previously described for region 20, the N channel MOSFET region. Therefore when fabricating a complimentary metal oxide semiconductor (CMOS) device, comprised of both N channel and P channel MOSFETs the novel pre-silicidation procedures, the HF-hydrogen peroxide, the spin dry, or the hydrogen dry etch, are performed only one time, after both the N type and P type source/drain regions have been formed.

After the pre-silicidation cleaning procedures resulting in removal of oxide and of arsenic based defects, and after an activation anneal procedure used to activate the implanted ions in all source/drain regions, a metal layer such as cobalt, nickel or titanium is deposited via physical vapor deposition (PVD), to a thickness between about 50 to 300 Angstroms. A first silicide anneal is performed in either a conventional or rapid thermal anneal (RTA) furnace, at a temperature between about 400 to 800° C., forming a first phase of metal silicide on surfaces of all source/drain regions and on the exposed top surface of all polysilicon gate structures. The metal layer remains unreacted on the surface of insulator spacers 5, and on the surface of STI regions 2. Removal of unreacted metal is selectively accomplished via a wet etch procedure featuring a solution comprised of $H_2O_2$, HCl, $NH_4OH$, $H_2SO_4$ and $H_2O$. A second anneal procedure is next performed again using a conventional or RTA furnace, at a temperature between about 650 to 850° C., resulting in formation of a second phase, a lower resistance metal silicide region, such as cobalt silicide regions 10. For titanium silicide the second anneal is not required. This is schematically shown in FIG. 5. The ability to remove native oxide and prevent or remove arsenic based defects allowed optimum metal silicide to be realized on all source/drain regions as well as on exposed polysilicon gate structure surfaces.

While this invention has been particularly shown and described with reference to, the preferred embodiments thereof, it will be understood by those skilled in the art that various changes in form and details may be made without departing from the spirit and scope of this invention.

What is claimed is:

1. A method of forming metal silicide regions on a semiconductor substrate, comprising the steps of:
   providing insulator filled, shallow trench isolation (STI) regions in top portions of said semiconductor substrate;
   providing a gate insulator layer on a portion of said semiconductor substrate not occupied by said insulator filled STI regions, and providing a conductive gate structure comprised with insulator sidewall spacers, on said gate insulator layer;
   performing an ion implantation of a dopant to form a source/drain region in a portion of said semiconductor not covered by said conductive gate structure;
   performing a pre-metal silicide formation treatment further comprising:
   plasma oxidizing the surface of the source/drain region to form an oxide thereon,
   treating the oxide with a first agent to remove the oxide, the treating resulting in dopant based defects,
   forming the dopant based defects into a solid compound or gas compound using a second agent wherein the first agent to the second agent has a ratio between about 1:1 to 1000:1, and
   removing the solid or gas compound; and
   forming said metal silicide regions on said source/drain region and on a top surface of said conductive gate structure.

2. The method of claim 1, wherein:
   performing the ion implantation forms an N type source/drain region: and
   removing the solid compound includes:
   forming the solid compound as a water soluble product; and
   rinsing away the water soluble product.

3. The method of claim 1, wherein removing the gas compound includes forming the gas compound as a volatile product using hydrogen.

4. The method of claim 1, wherein removing the solid compound includes spin drying the semiconductor substrate in a non-oxidizing gas.

5. The method of claim 1, wherein said ion implantation procedure is performed using arsenic ions, implanted at an energy between about 10 to 100 KeV, at a dose between about 1E 15 to 1E16 atoms/$cm^2$.

6. The method of claim 1, wherein said pre-metal silicide formation treatment is a wet treatment using a solution comprised with hydrogen peroxide as the second agent.

7. The method of claim 6, wherein said wet treatment used for said pre-metal silicide formation treatment is a solution of hydrofluoric (HF) acid as the first agent and hydrogen peroxide as the second agent, with a ratio of HF to hydrogen peroxide between about 1:1 to 1000:1.

8. The method of claim 6, wherein said wet treatment used for pre-metal silicide formation treatment is an initial dilute hydrofluoric (HF) acid cycle followed by a HF/hydrogen peroxide cycle, with a ratio of HF as the first agent to hydrogen peroxide as the second agent between about 1:1 to 1000:1.

9. The method of claim 6, wherein said wet treatment used for pre-metal silicide formation treatment uses hydrogen peroxide as the second agent spiked into a de-ionized water rinse performed after hydrofluoric (HF) acid as the first agent, at a hydrogen peroxide:water ratio between about 1:50 to 1:1000.

10. The method of claim 1, wherein said pre-metal silicide formation treatment is performed using an initial hydrofluoric (HF) acid only procedure with HF as the first agent, followed by a spin dry procedure, wherein the spin dry procedure can be performed in nitrogen using a single wafer or batch tool.

11. The method of claim 1, wherein said pre-metal silicide formation treatment is performed using aqueous hydrofluoric (HF) acid as the first agent followed by a hydrogen dry etch treatment, wherein a dry etch ambient is comprised with a hydrogen/argon or hydrogen/nitrogen ratio between about 1:0 to 1:100, at a pressure between about 20 to 300 millitorr, at an rf power between about 150 to 2000 watts, and performed at a temperature between about 15 to 40° C.

12. The method of claim 1, wherein said metal silicide regions are comprised of cobalt silicide or titanium silicide.

* * * * *